(12) United States Patent
Eng et al.

(10) Patent No.: US 6,177,723 B1
(45) Date of Patent: Jan. 23, 2001

(54) INTEGRATED CIRCUIT PACKAGE AND FLAT PLATE MOLDING PROCESS FOR INTEGRATED CIRCUIT PACKAGE

(75) Inventors: Kian Teng Eng; Min Yu Chan; Jing Sua Goh; Boon Pew Chan, all of Singapore (SG)

(73) Assignee: Texas Instruments Incorporated, Dallas, TX (US)

( * ) Notice: Under 35 U.S.C. 154(b), the term of this patent shall be extended for 0 days.

(21) Appl. No.: 08/992,354

(22) Filed: Dec. 17, 1997

(30) Foreign Application Priority Data

Apr. 10, 1997 (SG) .................................................. 9701115

(51) Int. Cl.[7] .................................................. H01L 23/52
(52) U.S. Cl. .......................... 257/691; 257/685; 257/780; 257/723; 257/724
(58) Field of Search ..................................... 257/676, 690, 257/691, 693, 692, 698, 700, 774, 777, 784, 680, 686, 685, 723, 730, 737, 738, 778, 724

(56) References Cited

U.S. PATENT DOCUMENTS

| | | | |
|---|---|---|---|
| 3,179,913 | 4/1965 | Mittler et al. | 339/18 |
| 3,370,203 | 2/1968 | Kravitz et al. | 317/101 |
| 3,459,998 | 8/1969 | Focarile | 317/100 |
| 3,904,934 | 9/1975 | Martin | 317/101 |
| 4,288,841 | 9/1981 | Gogal | 361/414 |
| 4,502,098 | 2/1985 | Brown et al. | 361/383 |
| 4,574,331 | 3/1986 | Smolley | 361/393 |
| 4,646,128 | 2/1987 | Carson et al. | 357/74 |
| 4,727,410 | 2/1988 | Higgins, III | 357/74 |
| 4,823,233 | 4/1989 | Brown et al. | 361/383 |
| 4,833,568 | 5/1989 | Berhold | 361/383 |
| 4,862,249 | 8/1989 | Carlson | 357/80 |
| 4,868,712 | 9/1989 | Woodman | 361/388 |
| 4,953,005 | 8/1990 | Carlson et al. | 357/80 |
| 4,996,587 | * 2/1991 | Hinrichsmeyer et al. | 23/2 |
| 5,016,138 | 5/1991 | Woodman | 361/381 |
| 5,019,945 | 5/1991 | Smolley | 361/412 |
| 5,583,378 | * 12/1996 | Marrs et al. | 257/710 |
| 5,672,909 | * 9/1997 | Glenn et al. | 257/668 |
| 5,739,585 | * 4/1998 | Akram et al. | 257/698 |
| 5,796,170 | * 8/1998 | Marcantonio | 257/786 |

* cited by examiner

Primary Examiner—Luan Thai
(74) Attorney, Agent, or Firm—Gary C. Honeycutt; Fred Telecky

(57) ABSTRACT

An integrated circuit package having a top opening and a cavity, with a chip adhered in the cavity. The top opening has routing strips electrically connecting the top opening with the outer surface. The routing strips are electronically connected to bonding pads located in a central area of the chip. Following assembly of the components, the top opening and the cavity are encapsulated in a molding process. A method is provided for forming a substantially flat integrated circuit package.

9 Claims, 4 Drawing Sheets

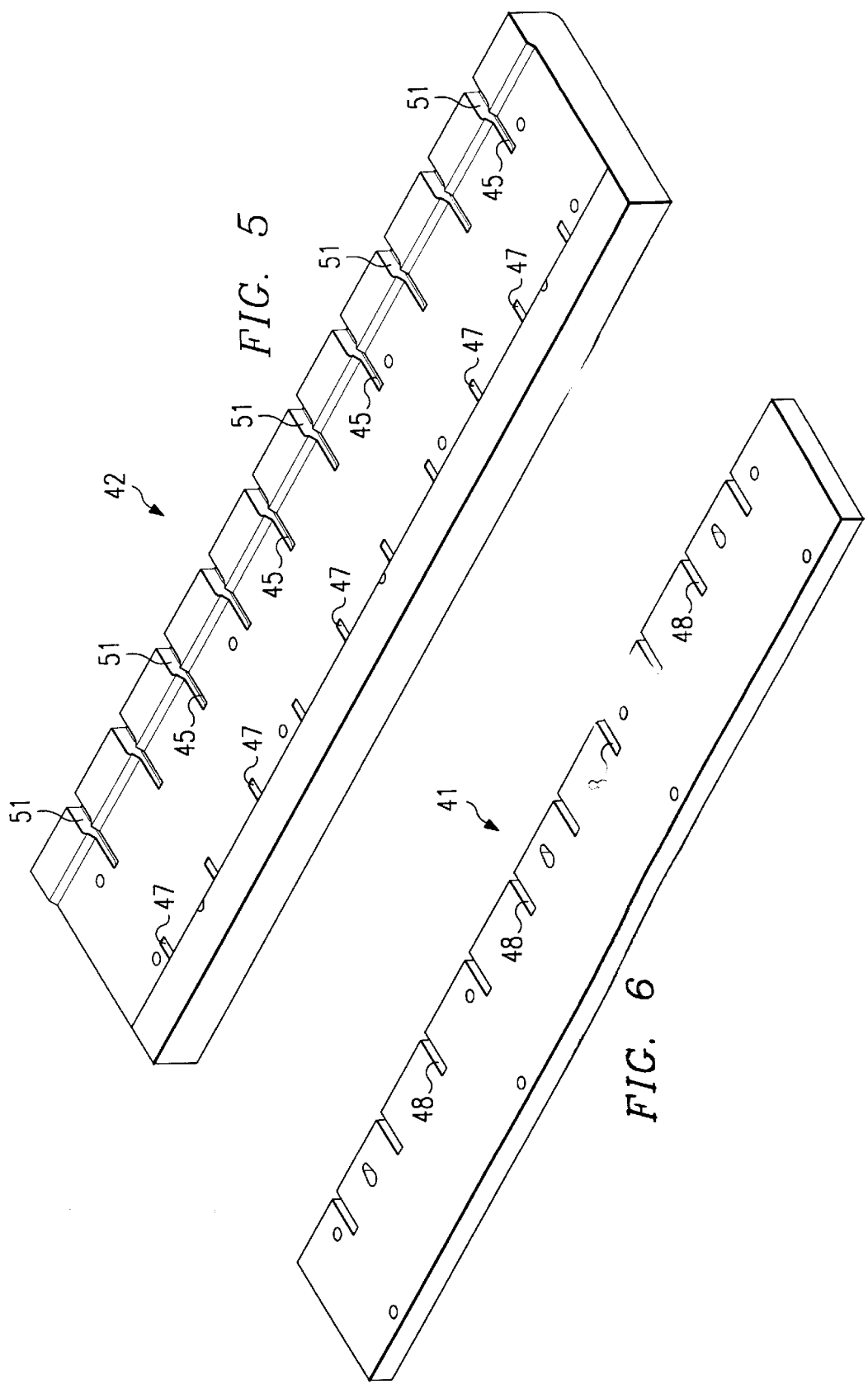

INTEGRATED CIRCUIT PACKAGE AND FLAT PLATE MOLDING PROCESS FOR INTEGRATED CIRCUIT PACKAGE

This application claims priority under 35 USC § 119 of the Singapore application number 970115-9 filed Apr. 10, 1997.

TECHNICAL FIELD OF THE INVENTION

This invention relates in general to the field of integrated circuit packages and more particularly to a substantially flat integrated circuit package employing an improved molding process for encapsulating a chip in a cavity on a substrate board.

BACKGROUND OF THE INVENTION

In the manufacture and assembly of integrated circuits, first, the integrated circuits are formed on semi-conductor wafers. The wafers are separated into individual chips and the individual chips are then handled and packaged. The packaging process is one of the most critical steps in the integrated circuit fabrication process, both from the point of view of cost and of reliability, in that the packaging cost can easily exceed the cost of the integrated circuit chip, and the majority of device failures are packaging oriented.

A key step in the integrated circuit fabrication is packaging the chip in a suitable medium that will protect it in subsequent manufacturing steps and from the environment of its intended application. In the typical packaging process, there are two main steps: wire bonding and encapsulation. Wire bonding connects the leads from the chip to the terminals of the package. The terminals allow the integrated circuit package to be connected to other components of the device. Following wire bonding, encapsulation is employed to seal the surfaces from moisture and contaminants and to protect the wire bonds and other components from corrosion and mechanical shock.

The packaging of integrated circuits has generally involved attaching an individual chip to a lead frame, where, following wire bonding and encapsulation, designated parts of the lead frame become the terminals of the package. The packaging of integrated circuits has also involved the placement of a chip on a flexible board where, following adhesion of the chip to the surface of the flexible board and wire bonding, an encapsulant is placed over the chip and the adjacent flexible board to seal and protect the chip and other components.

Known integrated circuit packaging techniques include the dual in-line package (DIP), the pin grid array (PGA), and the leadless chip carrier (LCC). With these known packaging techniques, the chips employ bonding pads on the outer circumference of the chip. This results in long leads from the bonding pads to the chip's circuitry.

The known integrated circuit packaging techniques have several disadvantages, particularly with regard to the encapsulation step. In the known techniques, the chip is placed on a lead frame or a flat surface of a flexible board, then a molding process is employed to place an encapsulant over the silicon chip. The molding process generally involves two plates which press against the lead frame or board and attached chip and, with reference to that plate placed adjacent to the chip, the plate includes a mold cavity for molding encapsulant over and around the chip. In addition to the mold cavities, these plates also have intricate conduits for providing the encapsulant to the mold cavity, commonly called main runners, subrunners and gates. The main runner provides encapsulant to a multitude of mold cavities; the subrunners provide encapsulant to individual mold cavities; and the gates provide a reduced cross-sectional area where, following the completion of the molding process, the cured encapsulant is cut.

The known techniques for molding encapsulant over a chip attached to a lead frame or the surface of a flexible board have several significant shortcomings. First, when converting from one package design to a second, different package design, the mold plates with integral mold cavities, gates, subrunners and main runner would often be required to be redesigned from the first package design to the second package design, as generally, the mold cavities in the plate would not align with the second design's placement of the chip on the lead frame or flexible board. Thus, there was significant design, engineering, expense, and lag time in redesigning molding plates when changing from a first packaging design to a second packaging design. Additionally, the encapsulation of a chip on a lead frame or on the surface of a flexible board requires an undue amount of encapsulant. Further, the protrusion of the chip beyond the board detracts from the package's protection in subsequent manufacturing and testing steps and from the environment of its intended application.

SUMMARY OF THE INVENTION

Accordingly, a need has arisen for an integrated circuit package and a molding process for encapsulating integrated circuit packages which avoids the placement of the chip on the exterior surface of a flexible board.

In accordance with the present invention, a molding process is provided that significantly improves the ability for a manufacturer to move from a first integrated circuit packaging design to a second integrated circuit packaging design. The present invention provides a flexible board having a cavity for silicon chip attachment, with the molding plates being flat or "cavityless". Thus, when moving from a first packaging design to a second packaging design, the molding plates need not be replaced or redesigned. This provides significant flexibility, cost, and lag time advantages when changing packaging designs. Additionally, the molding process reduces the encapsulant usage and provides additional protection to the chip and its electrical connections to the flexible board.

The present invention provides that the chip's bonding pads are located in a central area on the chip. This provides a significant advantage in allowing for short leads between the bonding pads and the chip's memory circuits. This can advantageously be used to increase a chip's memory capacity.

The integrated circuit package includes a base with a top opening and a cavity. Routing strips electrically connect the top opening to exterior connections. A chip with bonding pads located in a central area of the chip is adhered in the cavity and wire bonding is used to electrically connect the routing strips in the top opening with the bonding pads. The top opening and cavity are then filled with encapsulant to form a substantially flat integrated circuit package.

The molding process includes placing the pre-encapsulated assembly in a mold having flat upper and lower molding plates. The lower molding plate has a mold gate, and encapsulant is added through the mold gate to substantially fill the top opening and the cavity.

BRIEF DESCRIPTION OF THE DRAWINGS

A more complete understanding of the present invention and the advantages associated therewith may be acquired by referring to the accompanying drawings wherein:

FIG. 5 shows a lower molding plate for the molding process.

FIG. 6 shows an upper molding plate for the molding process.

DETAILED DESCRIPTION OF THE INVENTION

In integrated circuit manufacturing, various techniques are known to attach a chip, such as a silicon chip or semiconductor chip, to a flexible board, provide wire bonding for electrical connections, and encapsulate the silicon chip and wire bonding to seal and protect the individual components. The present invention has several advantages over the known techniques, including that the present invention allows increased memory on the chip; flexibility, cost, and lag time advantages when changing packaging designs; and a smaller, more durable integrated circuit package, which better protects the individual components.

Figure 1:
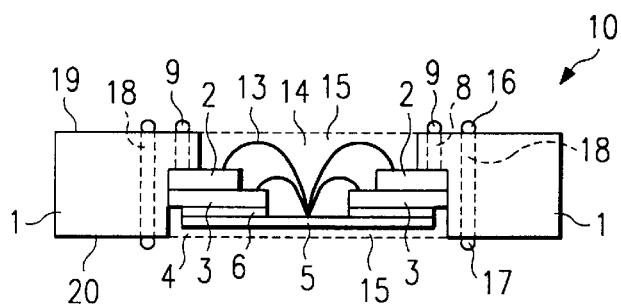
FIG. 1 is a simplified end cross-sectional view of an integrated circuit package produced by the process of the present invention.
Figure 2:
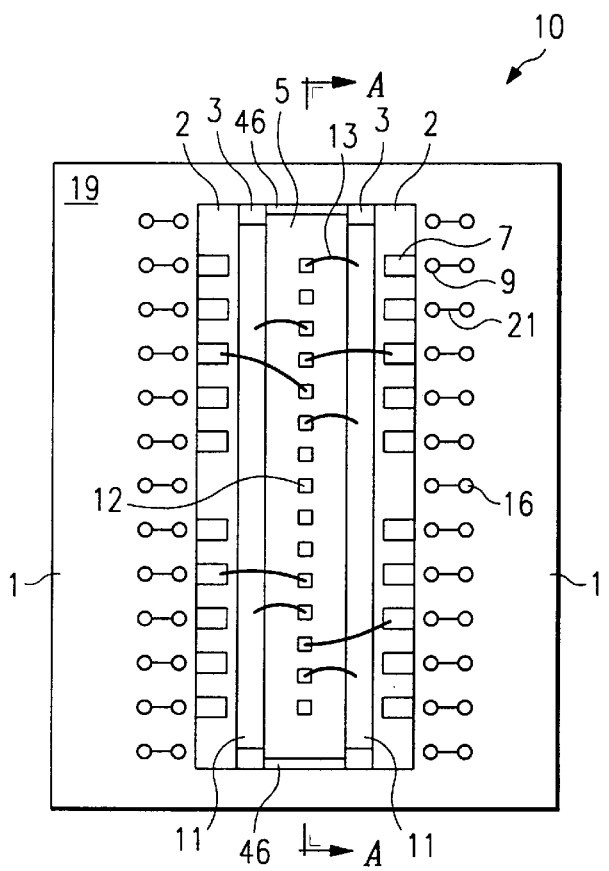
FIG. 2 is a simplified top view of an integrated circuit package produced by the process of the present invention.

FIG. 1 is a simplified end cross-sectional view of an integrated circuit package 10 made by the inventive process. FIG. 2 is a corresponding drawing showing a top view of the integrated circuit package 10. The package 10 has a first layer 1 which is also referred to as the PCB substrate. The other components and connections of the integrated circuit package 10 are built up upon the first layer 1 or PCB substrate. As discussed further below, the PCB substrate derives its name from its similarity to a printed circuit board ("PCB"), as it is constructed from a similar material and in a similar manner as printed circuit board. The package 10 also has a second layer 2 and a third layer 3, whose functions are further described below.

As used herein, particularly the terms "top" and "bottom", but also the terms "side" and "end" are used for illustrative purposes only, as the integrated circuit packages 10 of the present invention can be assembled and used in a variety of positions and ways.

As can be seen in FIGS. 1 and 2, the first layer forms a cavity 4 into which the second layer 2 and the third layer 3 are placed during construction of the package 10. A silicon chip 5 is adhered to the third layer 3 within the cavity 4 with an adhesive 6.

The second layer 2 has routing strips 7 which are electrically connected through a first conduit 8 to a first set of solder balls 9.

The third layer 3 is shown with two bus bars 11. The bus bars 11 are electrically connected through the second layer 2, through the first conduit 8 to one or more of the solder balls in the first set of solder balls 9. The bus bars may serve, for example, as power supplies or grounds, and it is preferred that one bus bar serve one function, such as a power supply, and the second bus bar 11 serve another function, such as a ground.

The silicon chip 5 has bonding pads 12, located generally in the central area of the silicon chip 5. The bonding pads 12 are connected to the routing strips 7 and bus bars 11 by wire bonding 13. The wire bonding 13 may be gold wire of about 1 mil. thickness.

The above described components and their construction and interrelation provide an assembly which is encapsulated as described below. The term "assembly" refers to the assembled components prior to encapsulation. The assembly consists of a base, an adhered chip 5 and wire bonding 13. The "base" consists of a PCB substrate having a top opening 14, and a cavity 4, with routing strips 7 and bus bars 11 extending into the top opening 14, with the top opening 14 and the cavity 4 being open to each other. An alternate way of fabricating the base is described below in relation to FIGS. 7 and 8.

Following the assembly of the above discussed components, cavity 4 and top opening 14 are filled with an encapsulant 15 which fills the space in the cavity 4 represented by the dashed line and in the top opening 14 represented by the dashed line.

Optionally, a second set of solder balls 16 and a third set of solder balls 17 may be utilized along with a second conduit 18 through the first layer 1. The first set of solder balls 9 are electrically connected to the second set of solder balls 16 by wire 21 or other electrical connections placed preferably on the top surface 19 of the package 10 (see FIG. 11 and discussion relating thereto) and the second conduit 18 serves to electrically connect the second set of solder balls 16 with the third set of solder balls 17, such that electrical connections may be made either to the top surface 19 or the bottom surface 20 of the package 10.

Preferably, the solder balls are made of about 37% Sn/63% Pb. Also, preferably, the solder balls extend about 0.5 mm above the surface of the package and are preferably spaced about 1 mm apart.

Figure 11:
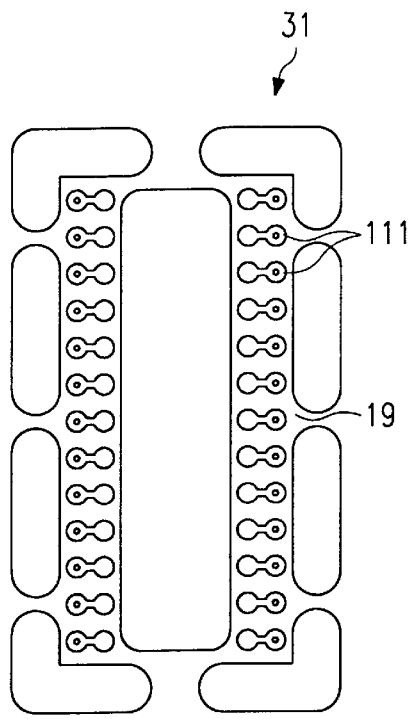
FIG. 11 is a top view of an embodiment of the center portion of a unit.

Alternatively, connection pads (not shown) may be used in place of the solder balls 9, 16, 17, and particularly, for the first set of solder balls 9 when the second set of solder balls 16 is used on the top surface 19 (see FIG. 11 and discussion relating thereto).

Figure 3:
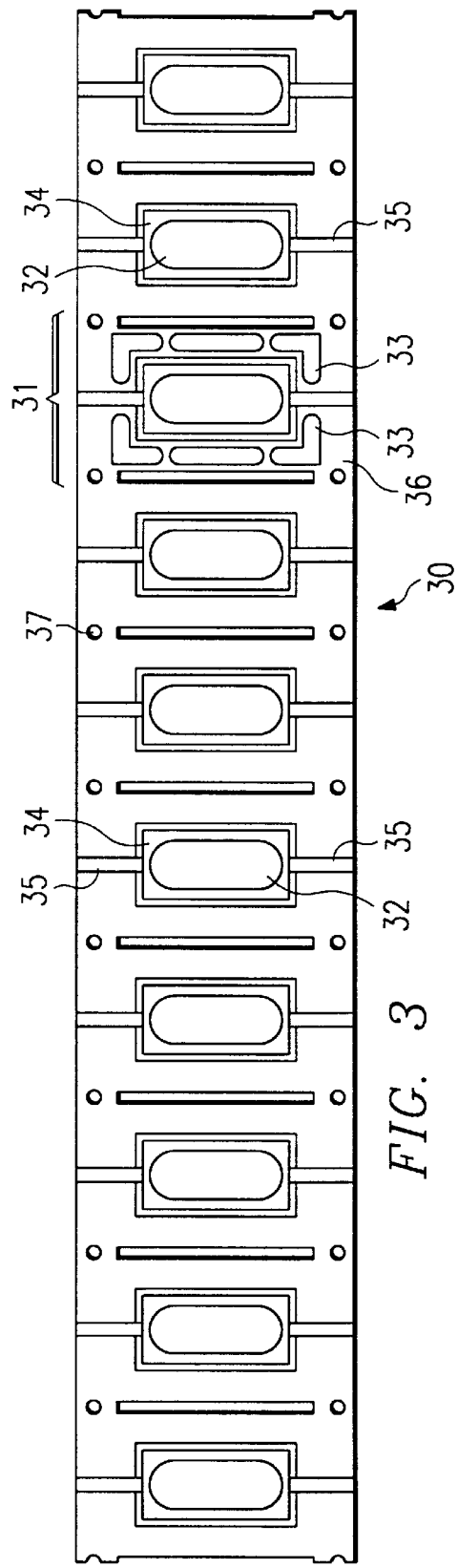
FIG. 3 is a simplified bottom view of a strip of 10 units of the first layer PCB substrate.

FIG. 3 shows a bottom view of the first layer 1, i.e., the PCB substrate, before any components have been added or adhered to the first layer 1. Here, ten units 31 are shown on a strip 30. Each unit 31 has a cavity 34 (corresponding to the cavity 4 of FIG. 1) and a top opening 32 (corresponding to the top opening 14 of FIG. 1). The units 31 may have open areas 33 surrounding the cavity 34 which served to reduce the amount of PCB substrate material used in the strip 30 as well as facilitate the removal of the completed package from the strip 30. Each unit 31 has a gold area 35 which serves to prevent the encapsulant from adhering to the PCB substrate, as discussed below, such that the strip 30 can be removed from the mold following curing of the encapsulant.

In operation, the strip 30 is passed from processing step to processing step as required to adhere the second and third layers, the silicon chip, to perform the wire bonding, and mold the encapsulant into the cavity 34 and the top opening 32. Following these processing steps, the completed package is cut away from the border 36.

The strip 30 has alignment holes 37 to facilitate correct placement of the strip 30 in the correct place at the various processing steps. Additionally, the strip 30 may have other markings serving as alignment guides (not shown) to facilitate the various processing steps upon the strip 30.

Figure 4:
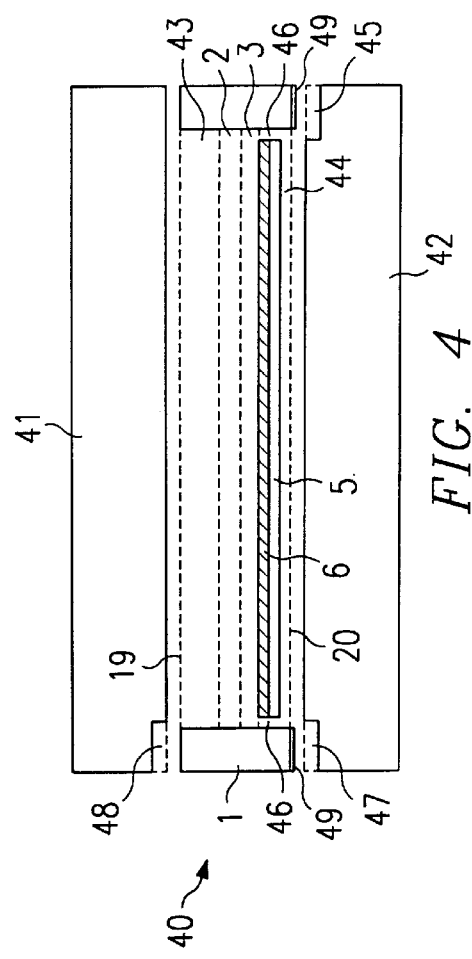
FIG. 4 is a simplified drawing showing the molding process for encapsulating the integrated circuit package.

FIGS. 4, 5 and 6 show the molds and molding process for injecting or flowing encapsulant into the mold and molding the encapsulant in the cavity. 44 (corresponds to cavity 4 of FIG. 1) and top opening 43 (corresponding to top opening 14 of FIG. 1). The assembly 40, i.e., the pre-encapsulated package, of FIG. 4 is a simplified cross-sectional view which corresponds to the view of FIG. 2 taken along line A—A.

Corresponding to FIG. 1, the assembly 40 has a first layer 1, a second layer 2, a third layer 3, a silicon chip 5, and an adhesive 6 which holds the silicon chip 5 to the third layer 3. FIGS. 4 and 6 show an upper molding plate 41. FIGS. 4 and 5 show a lower molding plate 42. With regard to FIGS. 5 and 6, it can be seen that if upper molding plate 41 of FIG. 6 is "flipped over" and placed on top of the lower molding plate 42 of FIG. 5, the two plates 41, 42 form a flat plate molding system.

The upper molding plate 41 and lower molding plate 42 are shown in FIG. 4 slightly removed from the first layer 1 in order to show the operation of the molding process. However, in an actual molding operation, the upper molding plate 41 and lower molding plate 42 would be adjacent to the first layer 1 and exerting pressure upon the first layer 1, such that the encapsulant cures, forming substantially flat surfaces at the top surface 19 and bottom surface 20.

In the molding operation, the upper molding plate 41 and lower molding plate 42 are compressed against the first layer 1. Encapsulant liquid flows through mold gate 45 into the cavity 44 (below and around silicon chip 5), through the space between the silicon chip 5 and the first layer 1 (see open space labeled reference number 46 on FIGS. 2 and 4) and into the top opening 43, filling both the cavity 44 and the top opening 43. Care should be taken to provide a suitable open space 46, as the flow of encapsulant through the open space 46 allows the encapsulant to enter and fill the top opening 43.

Gold areas 49 (corresponding to gold areas 35 of FIG. 3) are made of gold (or a low-adhesion gold alloy) and are provided to prevent the encapsulant from adhering to the first layer 1, as otherwise, it would be difficult to remove the first layer from the lower molding plate 41, and the cured encapsulant would otherwise be difficult to degate (cut and separate) at the mold gate 45. As shown, the gold areas 49 correspond to the mold gate 45 (and vent 47), such that when the encapsulant flows into the cavity 44, it only contacts the mold gate 45 and the gold areas 49. Preferably, the gold areas 49 are at least as wide as the mold gate 45.

The lower molding plate 42 has a vent 47 and the upper molding plate 41 has a vent 48. Vents 47, 48 allow air or inert gas (if processing steps are conducted in an inert atmosphere) to escape from the mold. In practice, a small amount of encapsulant also flows through the vents 47, 48 during the liquid filling of the cavity 44 and the top opening 43.

Preferably the runners 51 and gates 45 are polished to an SPI/SPE # 3 or better. Preferably, the vents 47, 48 are ground and polished to 0–1 microinch RA.

In operation, the plates 41 and 42 are placed within a mold chase (not shown) as is known to one of skill in the art. Generally, a mold chase employs at least two lower molding plates 42 and at least two upper molding plates 41. Within the mold chase, a main runner (not shown) supplies encapsulant to runners 51 (FIG. 5) which in turn supply the encapsulant to the mold gates 45, allowing the encapsulant to flow into the cavity 44.

Alternatively, but less preferred, the mold gate and/or vents could be located on the assembly 40, rather than on the molding plates 41, 42. This is less preferred, particularly with regard to the mold gate, because the encapsulant adheres strongly to the PCB substrate, making degating and mold release more difficult if the mold gate is on the assembly 40.

The preferred mold operating parameters are shown below.

| Parameter | Preferred Range |
| --- | --- |
| Mold Die Temperature | 175 +/− 5C |
| Mold Compound Pre-Heat Temperature | 85 +/− 5C |
| Mold Compound Pre-Heat Time | 22–26 Sec |
| Mold Close Cure Time | 120 +/− 5 Sec |
| Transfer Time | 10.8 +/− 2 Sec |
| Packing Pressure | 460 +/− 20 Psi |
| Fill Height | 26.0 +/− 5 mm |
| Cull Height Setting | 4.0 +/− 1 mm |
| Clamping Pressure | 3000 +/− 100 Psi |

Following completion of the molding process and referring to FIG. 3, the encapsulated packages, are cut from the strips 30.

FR-5 available from Nihon Micron Co., Ltd. of Japan is the preferred material for the construction of the PCB substrate. FR-5 has the following properties:

| Test | Remarks | Units | Hitachi FR-5 |
| --- | --- | --- | --- |
| Tg | DMA | | 195 |
| | TMA | C | 168 |
| Insulation | A | | 1.4 × 1018 |
| Resistance | D-2/100 | ohms | 7.5 × 1014 |
| Dielectric | A | | 4.89 |
| Constant | D-48/50 | — | 4.93 |
| Dissipation | A | | 0.0142 |
| Factor | D-48/50 | — | 0.0160 |
| Cu Peel | A | | 1.18 |
| Strength | 180°, 10 hr | kN/m | 1.05 |

The adhesive Hitachi HM122u (Tokyo, Japan) has proven to be reliable, for the interface between the silicon chip and PCB substrate. No misplaced die or cracked die defects were encountered.

Additionally, the chip 5 can be adhered to the PCB substrate with a die bonding film such as HIATTACH-335 (DF-335) manufactured by Hitachi Chemical Company of Tokyo, Japan. HIATTACH-335 (DF-335) is silver filled thermosetting type resin film for die-attaching. The bonding process generally involves attaching the film on the substrate (160° C., 5 sec, 1000–3000 g), then attaching the chip on the film (220° C., 5 sec, 150–200 g). DF-335 has the following properties:

| Test | Remarks | Units | DF-335 |
| --- | --- | --- | --- |
| Appearance | Visual | — | silver film |
| Solid Content | 200° C.- 2 h | wt % | ≧96 |

-continued

| Test | Remarks | Units | DF-335 |
|---|---|---|---|
| Ash content | 600° C. - 1.5 h | wt % | 40 |
| Ash content/solid | 600° C. - 1.5 h | wt %/solid | 42 |
| Thickness | Dial gauge | μm | 25 |
| Tensile strength | R.T. | kgf/mm$^2$ | 7.1 |
| Tensile modulus | R.T. | kgf/mm$^2$ | 271 |
| Die shear R.T. strength 250° C. | 4 × 4 mm chip /Ag plated alloy 42 | kgf/chip | ≧10 0.9 |
| Peel strength 240° C. (after 85° C./ 85%, 48 h) | 8 × 8 mm chip /bare alloy 42 | kgf/chip | ≧3.0 |
| Tg | TMA, 180° C.- 1 h cured | ° C. | 123 |
| Modulus | Viscoelastic spectrometer | MPa | 1300 |
| Moisture absorption | 85° C./85% RH, 48 h | wt % | 0.1 |

The encapsulant is preferably a cyanate ester-type resin available from Shin-Etsu Chemical Co., Ltd. as KMC 184VA and KMC 188VA-4. These have been tested and found to be successful for the transfer molding process. These encapsulants have the following properties:

| Test | Units | X-43-5500-3 |
|---|---|---|
| Viscosity (25 C) | cps | 33500 |
| Viscosity (80 C) | cps | 1150 |
| Gel Time (175 C) | sec | 45 |
| Cure | | 150C, 1 h→175 C, 4 h |
| Filler wt % | wt % | 75 |
| CTE | 1/° C.*10E-5 | 2 |
| Tg | ° C. | 160 |
| Flexural Modulus | kg/mm$^2$ | 10.5 |
| Flexural Strength | kg/mm$^2$ | 810 |
| Dielectric Constant (1 Mhz) | — | 3.29 |
| Dissipation Factor (1 Mhz) | — | 5.06 * 10E-3 |

Figures 7, 9, 10:
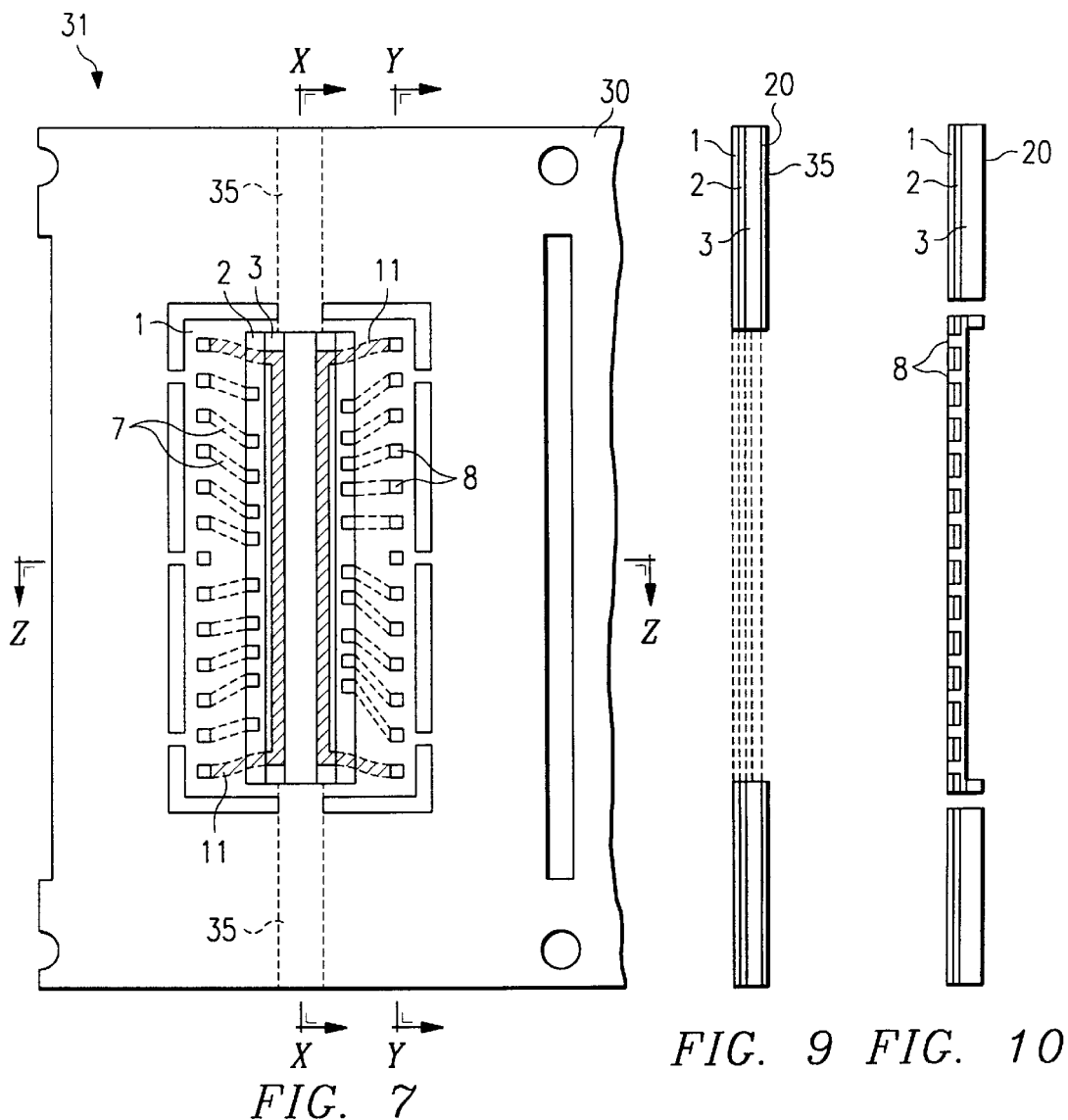
FIG. 7 is a top view of a partially assembled package prior to adhesion of the chip in the cavity.
FIG. 9 is a cross-sectional side view taken along line X—X of FIG. 7.
FIG. 10 is a cross-sectional side view taken along line Y—Y of FIG. 7.

FIG. 7 shows a top view of a partially assembled package having first layer 1, a second layer 2, and a third layer 3. This figure is similar to FIG. 2, but shows more of the details of the routing strip 7 on the second layer 2 and the bus bars 11 on the third layer 3.

Preferably, the conductor trace for the routing strips 7 have a width of about 0.2 mm and a thickness of about 0.05 mm. Preferably, the conductor trace for the bus bars 11 have a width of about 0.2 mm and a thickness of about 0.05 mm.

Figure 8:
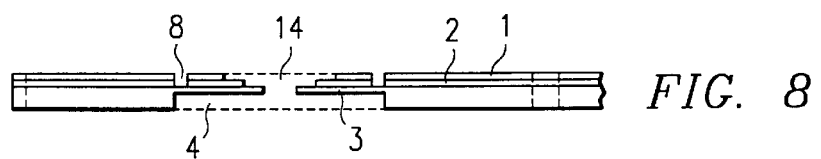
FIG. 8 is a cross-sectional end view taken along line Z—Z of FIG. 7.

As compared with the FIGS. 1 and 2 embodiment, FIGS. 7–10 show an alternative method of constructing or fabricating the package. This alternative method is best illustrated in FIG. 8, which is a cross-sectional end view taken along line Z—Z of FIG. 7. The FIG. 8 embodiment was constructed by a process known as "sequential lamination" and, as shown in FIG. 8, has at least three laminant layers.

There are many alternative ways that the sequential lamination strips 30 (of which FIG. 7 shows just one unit 31) may be formed, and the following discussion is illustrative of the many sequential lamination techniques which may be used. In the sequential lamination technique shown in FIG. 8, a first layer 1 is made for all ten units 31 on a strip 30 (see also FIG. 3). Then, a second layer 2, having the routing strips 7 already placed on the second layer 2, is adhered to the first layer 1 in a manner such that the ends of the routing strip 7 are exposed from the top as shown in FIG. 7. Likewise, a third layer 3, having the bus bars 11 as well as containing the cavity 4 (for later placement of the silicon chip 5), is adhered to the second layer 2 as shown in FIG. 8 in such a manner as to expose the bus bars 11 as shown in the top view of FIG. 7.

Thus, the base, i.e., the PCB substrate shaped with a top opening and a cavity with routing strips and bus bar(s) extending into the top opening, can be formed in a number of ways.

This sequential lamination process may be done in other ways, for example, individual layers 1, 2, 3 as shown in FIG. 8 may be constructed of many layers, some layers providing for the routing strip 7 and bus bars 11 with other, additional lamination layers being used as insulating layers above and below the layers containing the routing strip 7 and bus bars 11. As another example, the third layer 3 may be constructed of several lamination layers, for example, the layer containing the bus bars 11 may be separate from that layer forming the cavity 4.

Additionally, the fabrication methods of FIG. 1 and 2 may be combined with the sequential lamination technique of FIG. 8; for example, the first layer 1 and the second layer 2 may be laminated together with the second layer having additional lamination layers forming the cavity 4. After the cavity 4 is formed, a third layer 3 may be placed in the cavity 4 in a manner as shown in FIG. 1.

The PCB substrate and/or sequential laminated layers may be purchased from TechSearch International, Inc.

FIGS. 9 and 10 show side views of the FIG. 7 unit 31 along the X—X line and Y—Y line, respectively. FIG. 9 shows the sequential lamination construction with the same first layer 1, second layer 2, and third layer 3 as shown in FIG. 8. Additionally, FIG. 9 shows the gold area 35 on the bottom surface 20.

The first conduits 8 (FIG. 10) may be formed in any convenient way, such as by drilling in the individual first layer 1 and second layer 2, or they may be formed by drilling in the combined first and second layers after lamination of the second layer 2 to the first layer 1.

FIG. 11 shows a top view of a center portion of a unit 31, the unit 31 not having the second and third layers attached. The unit 31 shows electrical connections 111 on the top surface 19 of the unit 31. The electrical connections 111 provide connection pads for the placement of the first set of solder balls 9 and/or the second set of solder balls 16 as shown in FIG. 1 and as discussed with relation to FIG. 1. The electrical connections 111 are formed in a manner similar to electrical connections on printed circuit boards, as is known to those with skill in the art. The area on the top surface 19 surrounding the electrical connections 111 is coated with a "solder resist", similar to the coating commonly placed on printed circuit boards. A suitable solder resist is NA SOLDER RESIST available from Nihon Micron Co., Ltd. of Japan and also available from Lionapex Equipment Pte. Ltd. of Singapore.

A particular advantage of the present invention is that, with the package design of the present invention, the bonding pads 12 are in a central area of a chip, and more particularly, are in a central area of a rectangular chip. In the known board-on-chip (BOC) packages, generally, a square chip was used with bonding pads on the outer circumference of the chip. While the prior art packages are generally suitable for low memory devices, with the current trend toward higher memory requirements, the known packages with the bonding pads on the outer circumference of the chip are unsuitable because the electrical paths from the bonding pads to the circuitry on the chip (leads) are long paths, and as memory access increases, the increased electrical flow or current in the long leads of the prior art may exacerbate the capacitive loading effects of the leads. Further, the existence of long leads in close proximity to other electrical components could cause induction-type effects in those components, such as mutual inductance, wherein induction in one circuit links with another circuit and produces an electromotive force in it, thereby interfering with the second circuit's functioning. Additionally, inductance can cause induction heating leading to degradation of the chip.

With the current inventive package, the bonding pads 12 are in a central area of the chip 5, providing for much shorter electrical paths (leads) in the circuits on the chip. This advantage may be further increased by forming the chips in a rectangular shape and placing the bonding pads in the central area of the rectangular chip as shown in FIG. 2. The shorter electrical paths in the circuits on the chip 5 reduce the capacitive loading and induction-type effects, allowing more memory to be placed on a small chip. Shorter leads also allow faster access to the chip's memory circuits, allowing a shorter time period to transmit data into and out of the silicon chip.

The present inventive package, with its board-on-chip (BOC) design is particularly suitable for a 26 ball grid array (BGA) as shown in FIG. 2. The 26 ball grid array arrangement provides easy and reliable connections to printed circuit boards or other components of the overall device. The integrated circuit package of the present invention has high input/output potential with this 26 BGA.

The present inventive integrated circuit package and molding process have several advantages, including that it allows increased memory on a small size integrated circuit package which is also flat and thin. The present invention minimizes the amount of encapsulant used. Further, it utilizes flat molding plates which reduce the time and expwnse when moving from one package design to naother. Futher, the placement of the chip and the wire bonding within cavities and then encappsulating the cavities provides a more durable integrated circuit package. With the present ivention, a flat integrated circuit package 10 can be produced having a height of only about 0.7–1.0 mn.

It will be apparent to one of skill in the art that various modifications can be made to the embodiments disclosed and discussed herein. For example, the number of routing strips and bus bars may be reduces or increased and may include placement on additional layers, even beyond the second and third layer. Also, the 26 balll grid array terminals are only illustrative, and more or less terminals may be used, or terminals of a different desigh may be used. These modifications do not depart from the scope of the present invention.

Although the present invention has been described in detail, it should be understood that various changes, alterations and substitutions may be made to the teachings herein without departing from the spirit and scope of the present invention, which is defined solely by the appended claims.

What is claimed is:

1. An integrated circuit package, comprising:
   a base layer having an opening, to form a cavity, a second layer extending into the cavity, a third layer extending into the cavity, and an outer surface;
   routing strips integral with the second layer, the routing strips extending into the cavity;
   first electrical connections electrically connecting the routing strips with the outer surface;
   at least one bus bar integral with the third layer, extending into the top opening;
   at least one second electrical connection electrically connecting the bus bar with the outer surface;
   a chip adhered in the cavity, to the under side of said third layer, the chip having bonding pads located in a central area of the chip;
   first wire bonding located in the cavity and electrically connecting at least one first bonding pad with at least one routing strip;
   second wire bonding located in the cavity and electrically connecting at least one second bonding pad with the at least one bus bar; and
   encapsulant filling the cavity to form a substantially flat integrated circuit package having parallel upper and lower planar encapsulant surfaces.

2. An integrated circuit package, comprising:
   a base layer having a cavity, and an outer surface;
   routing strips integral with the base layer and extending into the cavity, the routing strips electrically connecting the cavity with the outer surface;
   a chip having its upper perimeter adhered to the under side of a ledge extending into the cavity, in the cavity, the chip having bonding pads located in a central area of the chip;
   wire bonding electrically connecting at least one of said bonding pads with at least one routing strip;
   encapsulant filling the top opening and the cavity to form a substantially flat integrated circuit package; and
   at least one bus bar integral with the base layer and extending into the cavity and electrically connecting the cavity with the outer surface; and wire bonding electrically connecting the at least one bus bar with at least one bonding pad.

3. The integrated circuit package of claim 2, wherein the cavity is open to the top of the base such that the central area of the chip having the bonding pads is accessible through the top opening.

4. The integrated circuit package of claim 2, wherein the wire bonding is located entirely in the cavity.

5. The integrated circuit package of claim 2,
   further comprising at least one solder ball located on the outer surface; and
   wherein the at least one solder ball is electrically connected with the at least one bus bar.

6. The integrated circuit package of claim 2, wherein the base comprises at least one third layer having the at least one bus bar thereon.

7. The integrated circuit package of claim 2, wherein the cavity depth is greater than the combined thickness of the chip and the adhesive.

8. The integrated circuit package of claim 2,
   wherein the base has a top surface and a bottom surface; and
   wherein the encapsulant fills the top opening to form a substantially flat surface with the top surface and the encapsulant sills the cavity to form a substantially flat surface with the bottom surface.

9. The integrated circuit package of claim 2,
   further comprising at least one solder ball located on the outer surface; and
   wherein the at least one solder ball is electrically connected with at least one routing strip.

* * * * *